United States Patent
Bourrieres

(10) Patent No.: US 7,032,306 B1
(45) Date of Patent: Apr. 25, 2006

(54) METHOD FOR PRODUCING MODULE

(75) Inventor: Francis Bourrieres, Montauban (FR)

(73) Assignee: Societe Novatec S.A., Montauban (FR)

( * ) Notice: Subject to any disclaimer, the term of this patent is extended or adjusted under 35 U.S.C. 154(b) by 0 days.

(21) Appl. No.: 09/830,253

(22) PCT Filed: Jan. 6, 2000

(86) PCT No.: PCT/FR00/00018

§ 371 (c)(1),
(2), (4) Date: Apr. 24, 2001

(87) PCT Pub. No.: WO00/47027

PCT Pub. Date: Aug. 10, 2000

(30) Foreign Application Priority Data

Feb. 5, 1999 (FR) .................................. 99 01390

(51) Int. Cl.
*H05K 3/34* (2006.01)
(52) U.S. Cl. ........................ 29/840; 29/842; 29/843; 29/832; 228/180.21; 228/180.22
(58) Field of Classification Search ................ 29/832, 29/833, 834, 840, 841, 854, 855; 174/176, 174/52.1; 228/178, 179, 180, 180.21, 180.22; 361/760, 764, 719; 257/713, 672, 737, 738; 438/106, 125, 615; 427/96–97.2
See application file for complete search history.

(56) References Cited

U.S. PATENT DOCUMENTS

| 4,830,264 A | * | 5/1989 | Bitaillou et al. ........ 228/180.21 |
| 5,027,191 A | | 6/1991 | Bourdelaise et al. ........... 357/74 |
| 5,147,084 A | | 9/1992 | Behun et al. ............... 228/56.3 |
| 5,539,153 A | * | 7/1996 | Schwiebert et al. ........ 174/260 |
| 5,570,274 A | | 10/1996 | Saito et al. .................. 361/784 |
| 5,581,875 A | | 12/1996 | Hibino et al. .................. 29/840 |
| 5,591,941 A | | 1/1997 | Acocella et al. ............. 174/266 |
| 5,658,827 A | * | 8/1997 | Aulicino et al. ........ 228/180.22 |
| 5,675,183 A | | 10/1997 | Swamy et al. ............... 257/723 |
| 5,675,889 A | | 10/1997 | Acocella et al. ............... 29/830 |
| 5,744,862 A | | 4/1998 | Iahii ........................... 257/693 |
| 5,758,409 A | | 6/1998 | Nakazato ..................... 29/739 |
| 5,838,545 A | | 11/1998 | Clocher et al. ............. 361/719 |

(Continued)

FOREIGN PATENT DOCUMENTS

DE 4326104 2/1995

(Continued)

OTHER PUBLICATIONS

Article: Leadless Bare attachment Technology for LOW-COST MCM-L By: Toshiyasu Shimada, Akihiro Dohya, Masaru Saitoh, Motoji Suzuki, Tuneaki Tajima, Teruyuki Kimura.

*Primary Examiner*—Minh Trinh
(74) *Attorney, Agent, or Firm*—Vidas, Arrett & Steinkraus

(57) ABSTRACT

The invention concerns a method for producing electronic modules with ball connector (7) or integrated preforms capable of being soldered on a printed circuit (3) and a device for implementing said method. The invention concerns a method for producing electronic modules in the form of ball housings combining a ball grid array (7) or geometrically identical preforms for interconnecting or shielding and surface-mounted components (2) on the same surface of a substrate (1), thereby enabling said module to be directly connectable by soldering on a printed circuit (3). The balls (7) and the components (2) are transferred in one single step onto the substrate (1) by means of a gripping device adapted to the topography of the module to be produced.

7 Claims, 10 Drawing Sheets

U.S. PATENT DOCUMENTS

| | | | |
|---|---|---|---|
| 6,533,160 B1 * | 3/2003 | Bourrieres et al. | 228/41 |
| 6,689,412 B1 | 2/2004 | Bourrieres | 427/58 |
| 6,691,406 B1 * | 2/2004 | Prindivill et al. | 29/832 |

FOREIGN PATENT DOCUMENTS

| | | |
|---|---|---|
| JP | 04-300072 | 10/1992 |
| JP | 6224323 | 8/1994 |
| JP | 08-064983 | 3/1996 |
| JP | 09-130031 | 5/1997 |
| JP | 10-074887 | 3/1998 |
| JP | 10-163263 | 6/1998 |
| WO | 0025358 A | 5/2000 |

* cited by examiner

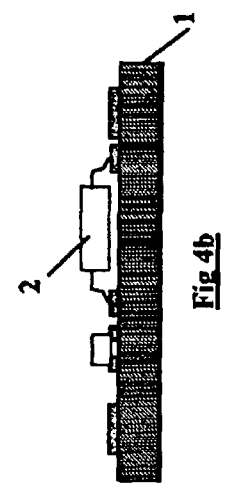
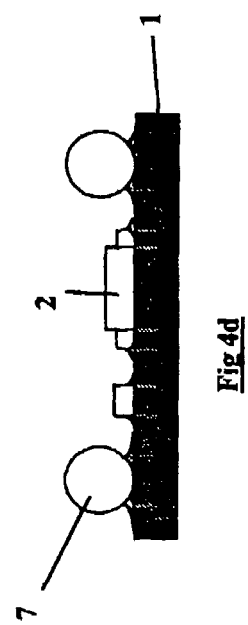
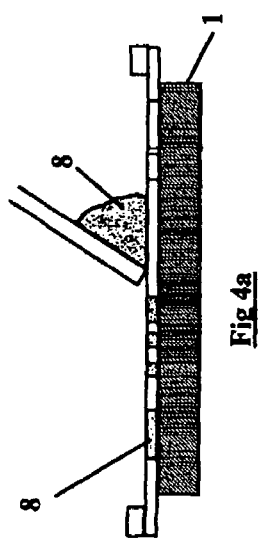
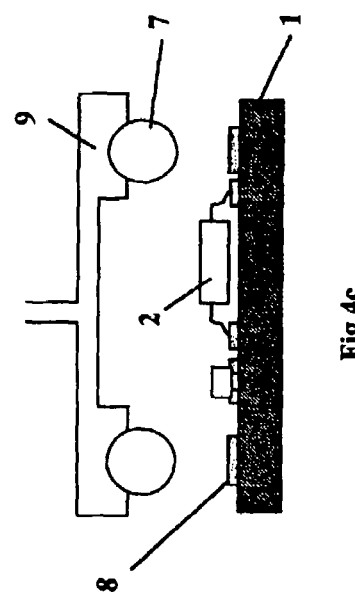

METHOD FOR PRODUCING MODULE

This invention regards a method for producing electronic modules that include surface-mounted components as well as connecting balls or preforms on the same surface of a substrate.

Electronic modules are used with increasing frequency because they offer numerous advantages. For example, they make it possible to increase the component density and thus to include more functionalities in an identical volume. They also make it possible to reduce the number of components to be transferred to the final assembly of electronic cards and to thereby reduce the opportunities for defects, since the module can be assembled and tested separately, then used as a component in the card.

Traditionally, electronic modules are produced by mounting surface components called SMCs on a ceramic or glass epoxy substrate. Then, to connect the module thus produced to the electronic card that is to receive it, several techniques can be used. For example, pins soldered onto the substrate in flat position allow the interconnection of the module perpendicularly to another electronic module by inserting the free part of these pins through holes in this electronic card; the module can then be wave-soldered or, if required, reworked manually.

These modules have several disadvantages such as, for example, a high manufacturing and implementation cost, for, on the one hand, the positioning of the pins is difficult to be automated and, on the other hand, the pins must be inserted into the holes by hand, for modules inserted vertically are not conducive to the automatic suction gripping usually used for SMCs. Furthermore, these modules do not allow very high densities given the limited number of interconnection pins. Finally, the size of these modules is not very compatible with the miniaturization requirements of modern electronics.

Another mode of manufacturing of electronic modules consists in placing a female connector on the module and a male connector on the receiver card of the module. In this case as well, the module must be positioned by hand, and the cost of these connectors is still high.

Another method for producing electronic modules according to the prior art consists in placing the SMCs on the top surface of a ceramic or glass epoxy substrate and producing the interconnections on the other side by positioning and soldering balls there. This module may then be transferred and soldered onto an electronic card in the same way as a standard ball component. The production price for this type of module is still high, for production of the balls is an additional operation. Furthermore, suction gripping can sometimes be difficult to use because the components on the top part can obstruct the movement of the gripping device.

Patents U.S. Pat. No. 5,838,545 and U.S. Pat. No. 5,675,183 claim an electronic module comprising on its top face a radiator and on its bottom face integrated circuits in the middle of interconnection elements that make it possible to connect the module to another level. These patents do not give any information concerning the method for producing this type of electronic module. Specifically, we shall see in the description that follows that this invention is a method that permits to produce of electronic modules of this type at a lower cost than the prior art as it is known in these patents.

Patents U.S. Pat. No. 5,570,274 and U.S. Pat. No. 5,027,191 describe other electronic modules for which the interconnection elements between the module and the printed circuit that receives this module are on a different plane than the one comprising the electronic components. To produce this offsetting between planes, either a cavity is produced into which the components are transferred or a positioning spacer is inserted to allow the stacking on top of each other of the interconnecting elements. In these cases, again, this invention provides a solution that makes it possible to produce these modules more easily and therefore at a lower cost.

The method targeted by this invention makes it possible to eliminate the problems of the prior art, but also resolves a few other problems as well, as will become clear in what follows.

The method for producing an electronic module according to the invention is characterized in that:

the substrate used comprises on the same face mounting lands adapted to the surface-mounted components, ensuring the electronic function of the module, and also to the balls, ensuring the electrical and mechanical connections between the module and the printed circuit that is to receive this module, in a single and same operation, a soldering cream is deposited onto said mounting lands corresponding to the SMCs, as well as to those corresponding to the interconnection balls or preforms. The soldering cream depositing process via serigraphy is specially adapted to accomplish this deposit simultaneously on the lands of the SMCs and the balls, but this soldering cream may also be deposited using a syringe.

said connecting balls, generally made of high-temperature lead-tin such as, for example a 90% lead/10% tin alloy, have a diameter greater than the height of the tallest electronic component making up the module, said surface-mounted components and said interconnection balls are transferred one after another onto the deposits of soldering cream made previously on the substrate of the module, said balls are transferred at the same time like a SMC component using an adapted gripping device, a temperature cycle allows the soldering cream to reflow in order to solder both said SMCs and also the connecting balls, the module thus produced can be connected directly to a printed circuit like any other component with connecting balls.

Since the electronic components and balls are on the same side of the substrate, the connecting elements are produced in the same operation as the electronic function of the module, which makes it possible to produce the interconnection function at a price of around one centime per connection, while according to the prior art the price was easily 10 centimes per connection.

Furthermore, as the electronic components are arranged on the same side as the connecting balls, the other side is therefore free to allow gripping of the module by suction, just like any other surface-mounted component.

Additionally, by arranging the connecting balls around the perimeter of the electronic components and in several rows, if necessary, which appreciably increases the potential interconnection density and by providing a ground plane on the substrate, which may naturally be multi-layered, it is possible to produce an electromagnetic shield for the module without any additional operations, while these shields are normally produced by adding a metal cap onto the components likely to emit or to be sensitive to electromagnetic radiation. These caps are particularly disruptive to the manufacturing process for electronic cards, since they are not only additional parts, but are also difficult to solder.

This method can also make it possible to produce ball housings with low electromagnetic pollution. It is thus possible to integrate electronic components such as decoupling capacitors during the same work phase as the BGA balling operation. With the widespread use of rapid logic circuits, the filtering of power sources and inputs/outputs of large integrated circuits presents a problem not satisfactorily resolved until now. Effectively, the numerous connections that converge toward the housing leave only a small space for setting filtering elements. These filtering elements are therefore located far from the housing, and problems of electromagnetic compatibility then appear:

- electromagnetic radiation from clock pulses and rapid signals,
- susceptibility to external radiation, with system malfunctions.

Given the requirement of the EC standards, these problems are no longer acceptable today and are resolved by installing shields. However, shield installation is a costly operation that requires skills that are not always available. Experience shows that in many cases, it would suffice to reduce the radiation by ten or fifteen decibels to achieve compliance with the standards. Our solution provides an improvement of this magnitude, and thus very often allows the designer to do without shielding. This new ball housing system provides an optimized solution to the problems of electromagnetic compatibility by allowing components to be installed near the integrated circuit chip. More precisely, this housing allows the installation of components on its bottom side, among the connecting balls.

One will easily understand the interest of placing the decoupling capacitors, for example, between the positive of the power feed ball and the grounding ball: the current impulses remain localized in a very short circuit, which greatly reduces electromagnetic radiation and pollution of the card.

The problem of radiation from clock pulses is also solved by implanting quartz adapting capacitors to the positive close to the chip between the output balls and a local ground located on the housing. Radiation may be reduced even further by installing a resistor directly onto the housing in series with the output of the oscillating gate. Very high frequency radiation is reduced considerably, for the output of the gate is no longer charged by the card's capacitors. In general, all steep surge outputs can thus be charged by a small serial resistor on the housing itself.

Some inputs are susceptible of being disturbed by R.F. signals and, as a result, require that these signals be filtered. These include, for example, analog inputs of analog/digital converters or low level analog inputs. With the advent of low voltage logic circuits, R.F. disturbances may even affect logic inputs. Our system will allow the fitting of a filtering unit directly on the housing among the balls. The reduced size of this circuit will protect it from disruptive radiation, particularly radiation from EC standard compatibility testing.

Other advantages and features of the invention will become clear upon reading the following description of the invention illustrated by the appended drawings in which:

FIG. 4 shows the production sequence for a module according to the invention

Figure 6:
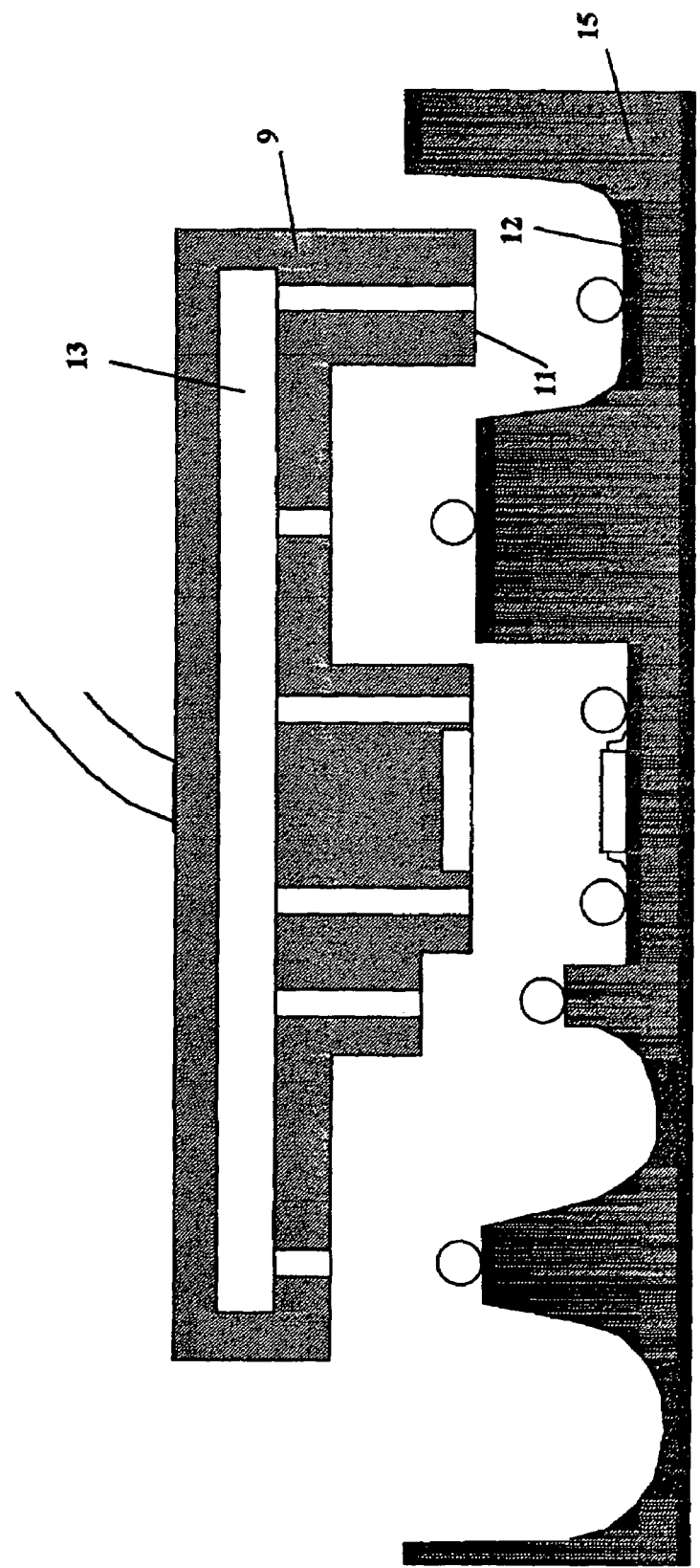
Figure 7:
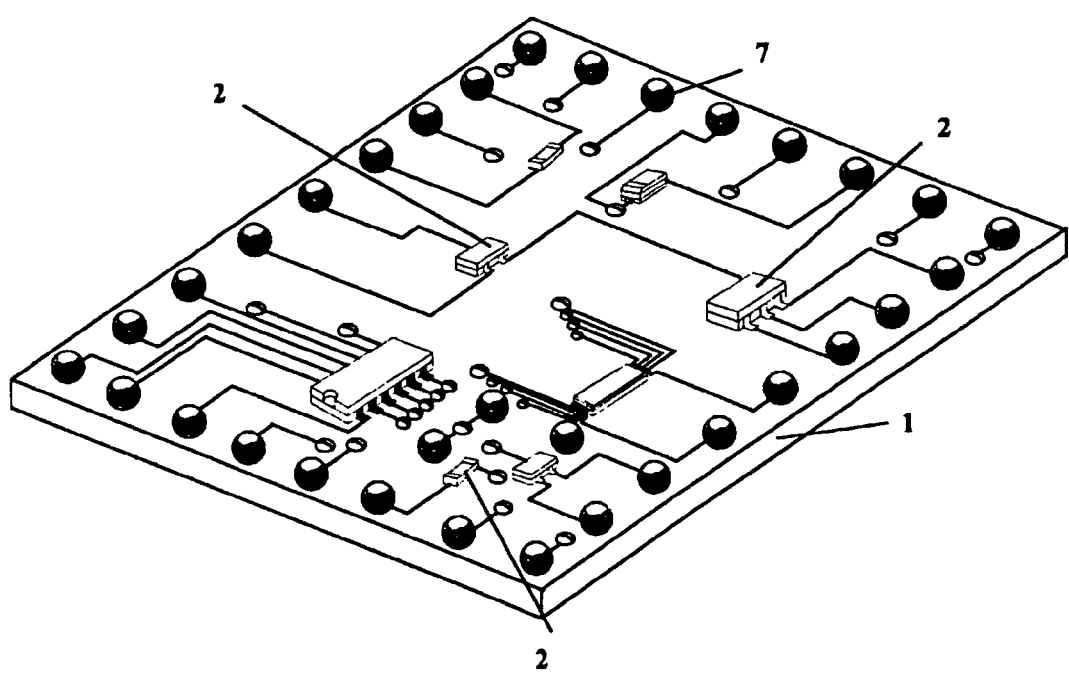
Figure 8:
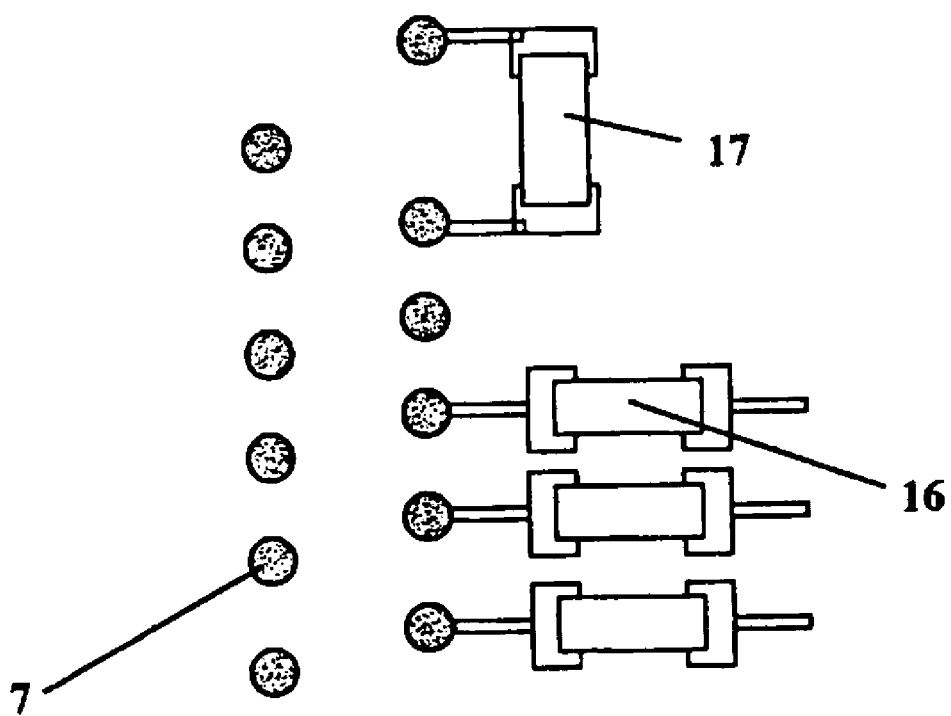
Figure 9:
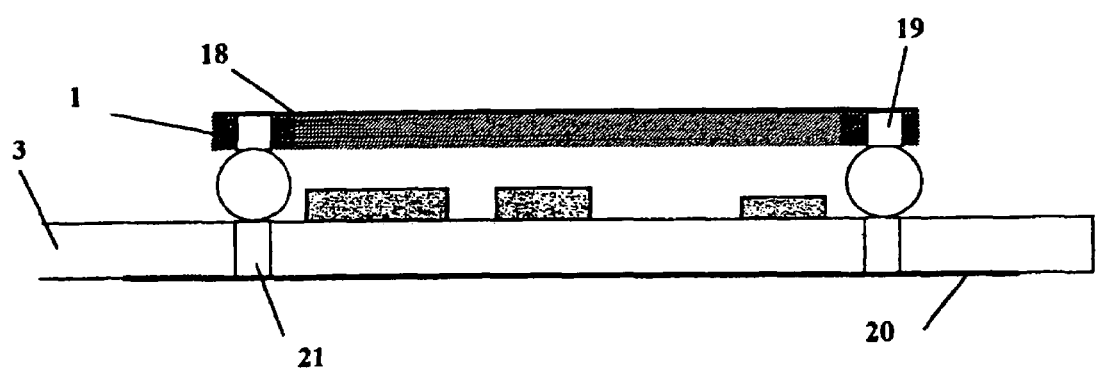
Figure 10:
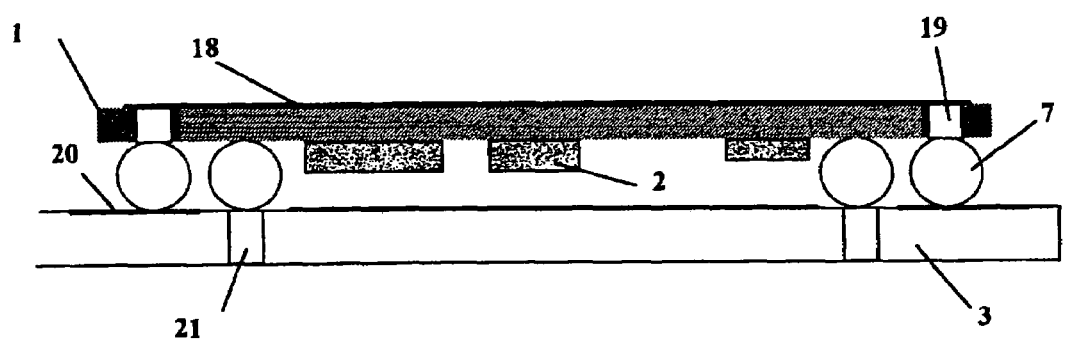

FIG. 6 shows another gripping device according to the invention, adapted to a three-dimensional circuit, FIG. 7 illustrates the type of module that can be produced thanks to the invention, FIG. 8 is a schematic representation of a BGA with its connecting balls and related Surface Mounted Components, FIG. 9 shows a bare ball circuit without components (no chips or SMC) with a single shielding function, FIG. 10 represents a ball circuit that is a module that accomplishes a function and acts as a shield at the same time.

Figure 1:
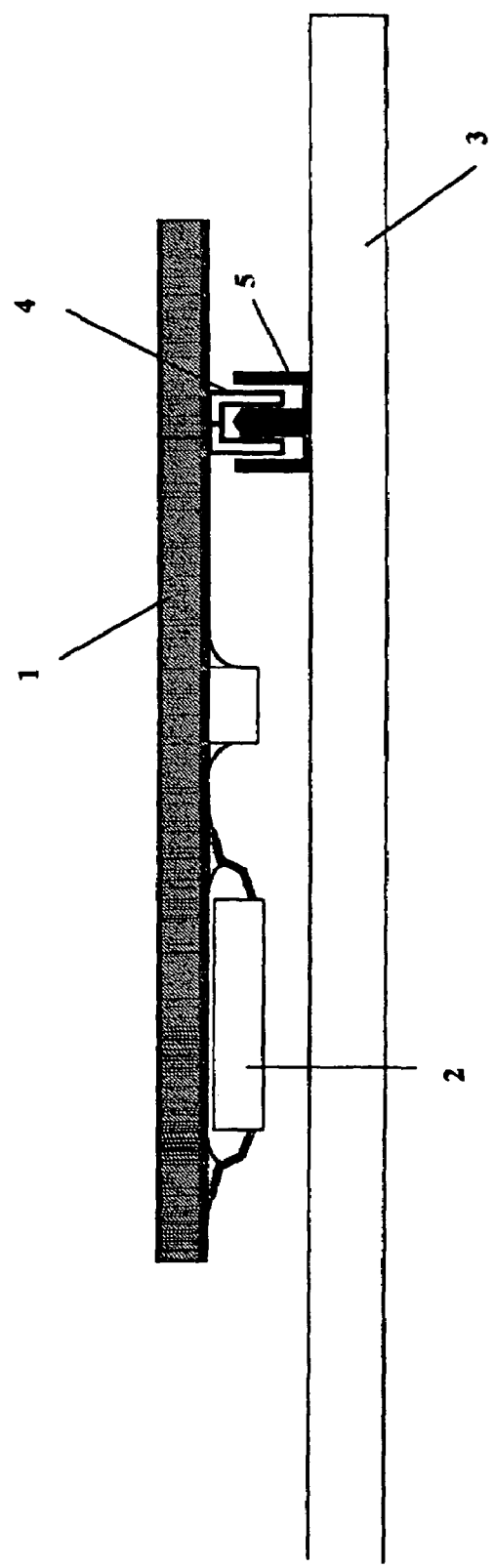
FIGS. 1 and 2 illustrate electronic modules according to the prior art.

FIG. 1 represents an electronic module of the prior art consisting of a substrate (1), components (2) and a female connector (4) that is connected to a printed circuit (3) by a male connector (5). In this example, it is therefore necessary to solder a male connector onto the module and a female connector onto the printed circuit, which, added to the price of the connector, makes this technique very expensive. Additionally, in order to reduce the number of connectors, this technique requires the designer of the card and of the module to lead all the inputs and all the outputs to the same spot, which creates space and product design constraints.

Figure 2:
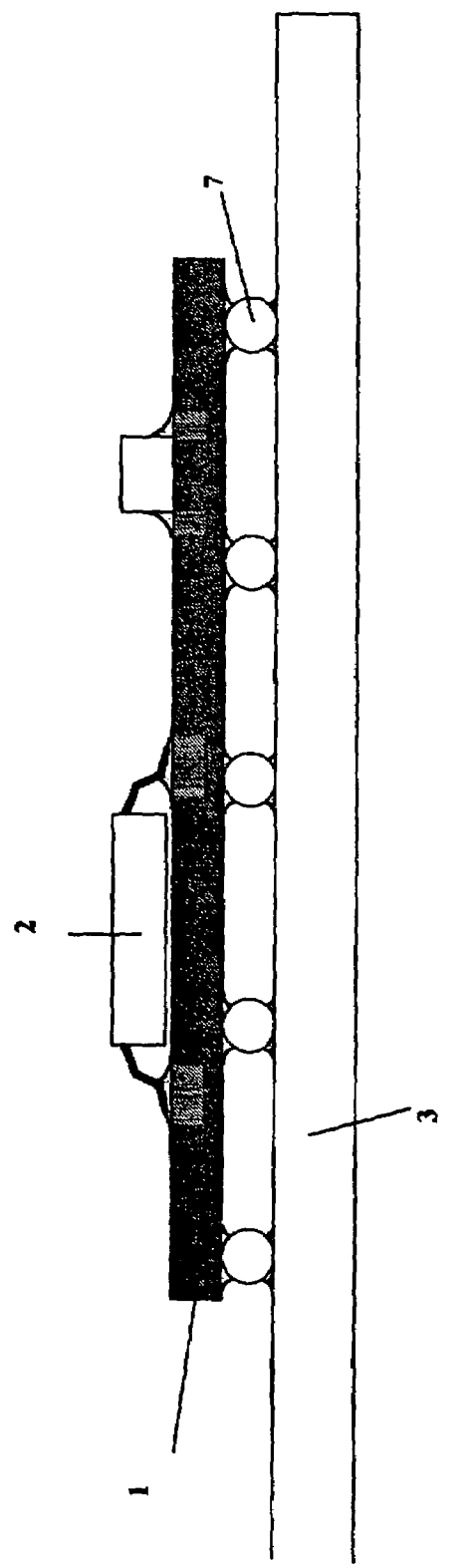

FIG. 2 shows a cross-sectional view of another electronic module of the prior art consisting of a substrate (1) and components (2) and that is connected to the printed circuit (3) by balls (7). In this case, the installation of balls on the module is done after the substrate is equipped with electronic components and therefore requires the depositing of additional soldering cream on the substrate, transferring balls onto the deposits of cream, and requires a second re-melting operation in order to solder the balls onto the substrate. This solution, although interesting from the standpoint of the component density it allows, remains costly and therefore difficult to generalize for widely disseminated products.

Figure 3:
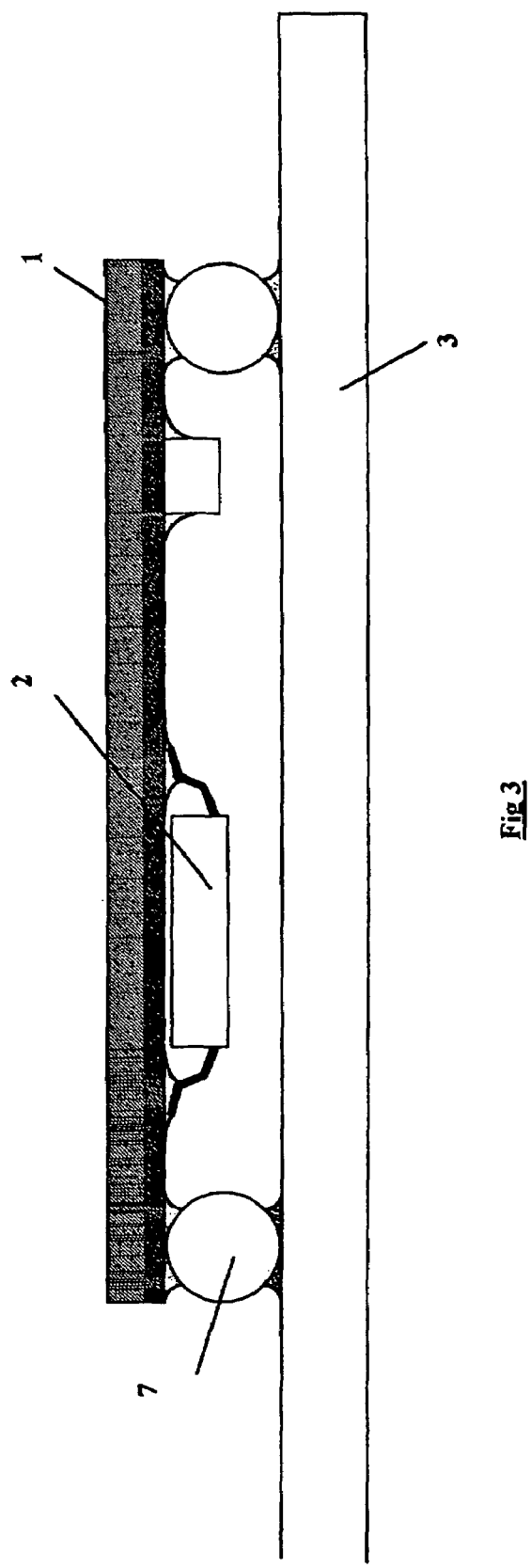
FIG. 3 shows an electronic module produced according to this invention.

FIG. 3 shows a cross-sectional view of a module produced according to this invention. The balls (7) and components (2) are, in this case, transferred onto the same face of the substrate (1). Interconnection with the printed circuit (3) is therefore accomplished by balls (7) that have a sufficient diameter to make it possible to place the components between the substrate (1) and the printed circuit (3) without any mechanical interference.

FIG. 4 illustrates the production sequence for an electronic module according to this invention. First, soldering cream (8) is deposited via serigraphy onto the mounting lands related to the electronic components and to the balls of the substrate (1). Then one transfers electronic components (2) onto the substrate using known means, followed by the gripping and collective transfer of the balls (7) thanks to the gripping device (9). Finally, the soldering cream is reflowed, which permits soldering of the electronic components and the balls simultaneously onto the substrate. It should be noted that it is possible to reverse the order for transferring the components and the balls without challenging this invention.

The method according to this invention is therefore a means of producing electronic modules that are particularly inexpensive and that furthermore can have shielding features without requiring the addition of supplementary parts. The device targeted by patent application FR98.13424 by the same inventor is particularly suited to making connecting balls available in order to transfer them simultaneously using a gripping device. Furthermore, for enhanced facility, the gripping device may be chamfered opposite the surface components in order to prevent any interference between the components present on the module at the time the balls are transferred.

It should also be noted that it is conceivable to transfer chips, in addition to the SMC devices, directly onto the electronic module either on the same side as the connector balls and/or on the other side.

To further increase the component density on the module, surface-mounted components soldered at the same time as the connecting balls or other elements may be transferred onto the side opposite the side comprising the connecting balls.

To implement said method, it is necessary to get away from the size constraints linked to components that are as different as surface-mounted components or even to obstacles that could be present on the surface of the substrate and the connecting balls or preforms. In the production process, it is preferable to position the electronic components first and then the balls or preforms, since these balls or preforms have a very small contact surface and while their hold on the soldering cream is admittedly sufficient in static state, as soon as motion is applied with accelerations, as is the case during transfer onto the component installation machines, the balls are in danger of shifting and of moving off their mounting land. In order to get around this disadvantage, a device used for gripping and for transferring the balls or preforms has a working face whose configuration is adapted to the dimensions and to the shapes of the balls or preforms to be gripped in order to avoid any contact with the electronic components or any other obstacle that might be present on the surface of the substrate and already in place when said balls are positioned.

Figure 5:
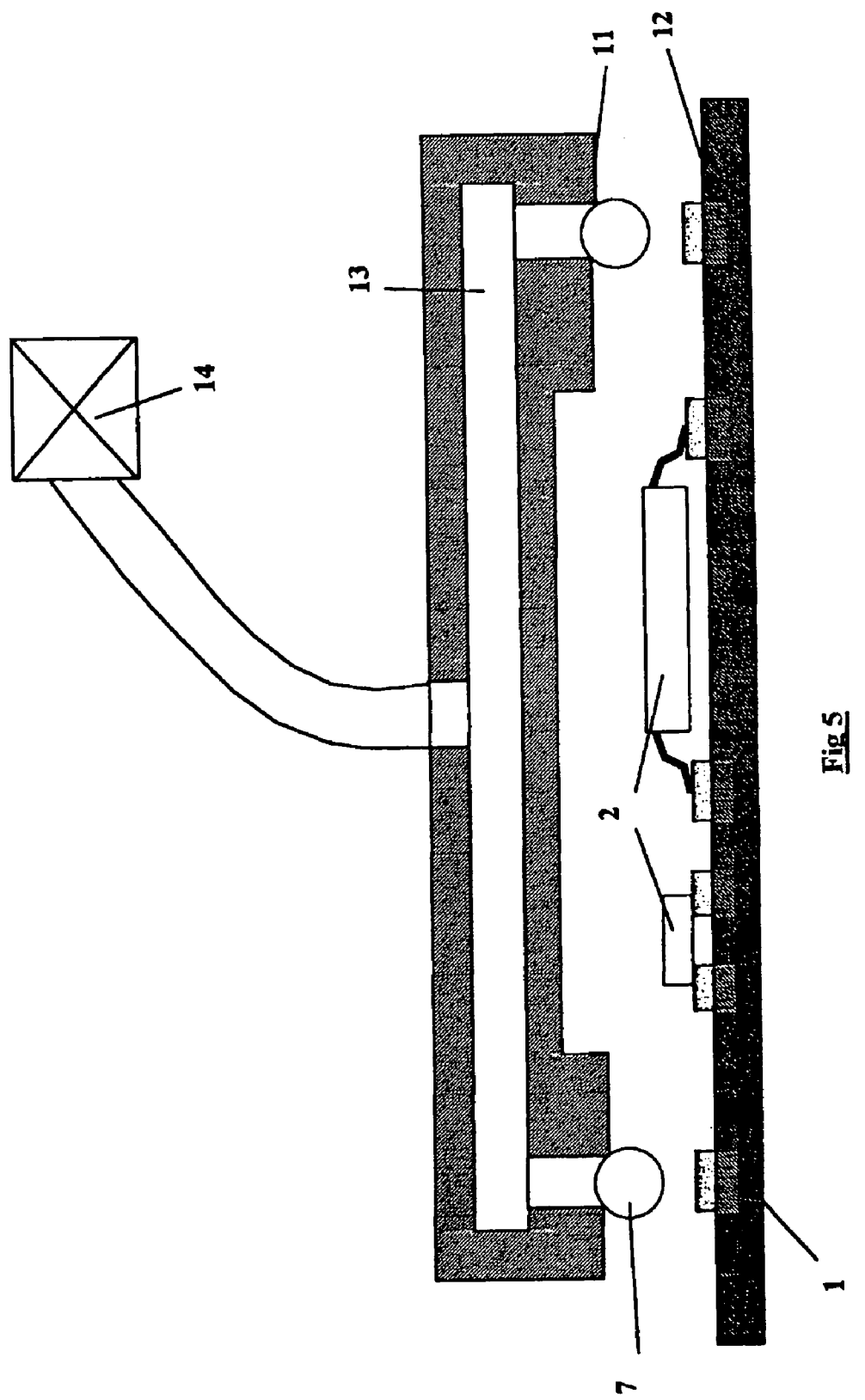
FIG. 5 shows a gripping device adapted to the invention.

According to a preferred mode of embodiment of the gripping or transfer device shown in FIG. 5, the gripping device has a working face (11) parallel to the face (12) of the substrate (1) to be equipped. This working face (11) has been spot-faced so as not to interfere with the components during application of the balls. On this working face there are suction and holding holes for all the balls or preforms. The holes communicate with a vacuum chamber (13), which itself communicates with a vacuum generator (14). Thus when suction is applied by the vacuum generator, the balls (7) are sucked up and held in this position. The gripping device may then be placed opposite the substrate already equipped with surface-mounted electronic components. The gripping device is lowered vertically until the balls come into contact with the substrate; the suction is cut off, and the gripping device can then be lifted.

According to another feature, the gripping device according to the invention and pursuant to the method is equipped with orifices for gripping and transferring balls or preforms in accordance with the intervals between balls. These are generally constant for a same circuit, but it is possible to imagine different intervals.

According to another feature of the device according to the invention, it is possible to install balls or preforms on different planes or levels; these balls or preforms may also have different diameters or shapes; in this case, the configuration of the working face if the gripping device is adapted both to the configuration of the printed circuit, which may be three-dimensional, and the side defined by the lower part of the balls or preforms. In all cases the sides between the surface of the substrate and the side defined by the lower part of the balls or preforms are parallel.

According to another feature, the device according to the invention may have a known system for supplying balls or preforms; this may be a reservoir where the balls and preforms are all identical but stored loose, which can be a device such as the one targeted by patent application FR98.13424 by the same inventor.

In FIG. 6, we see a three-dimensional molded circuit (15). The gripping device (9) equipped with a vacuum chamber (13) has a three-dimensional working face (11) and an adapted configuration. This is an additional example of what it is possible to produce using this invention.

FIG. 7 represents an example of an electronic module that can be produced as a result of this invention. The balls (7) and components (2) can be arranged over the entire surface of the module as the designer sees fit. Thus, it becomes possible to achieve very high densities, and the designer of electronic products can optimize his product.

FIG. 8 shows the component location on the ball circuit; of course, it will be possible to provide component locations even if they are not established, the location being open to configuration based on needs. (17) is a decoupling capacitor between two balls and (16) refers to serial resistors with the outputs.

By placing the balls over the entire periphery of the housing, we can produce a Faraday cage whose height is equal to the diameter of the balls. It will suffice for that to create two ground planes (a lower ground plane and an upper ground plane) connected electrically to one another by balls that therefore become shielding balls distinct from connecting balls that allow the electrical connection of the components of the electronic module to the printed circuit that receives the module. Many configurations are possible, depending on the sides on which these conductor layouts are arranged. First example, in FIG. 9: the ball circuit serves solely as a shield. A conductive plane (18) is arranged on the upper face of the ball circuit; conducting feed-throughs (19) connect the balls to this plane. The components to be shielded are arranged on the main circuit (3). The lower face of the main circuit constitutes the lower conductive plane (20), which is also connected to the balls (7) by conducting feed-throughs (21). Second example, in FIG. 10: the ball circuit is itself a module with a function (oscillator, R.F. amplifier, R.F. filter, etc.); in this case, the lower conductive plane (20) is situated above the printed circuit (3) and the conducting feed-throughs (21) make it possible to lead the electrical signals back to the lower face of the printed circuit (3). It comprises components on its lower face. In all these configurations, connecting balls are part of the shield. The distance between each ball will, of course, have an influence on the effectiveness of this shield, since the interval between each shield ball is a hole in said shield. For balls two millimeters in diameter and spaced four millimeters apart, we obtain a shield that is already highly effective even beyond the Gigahertz range. It is especially important that each shielding ball have its own contact feed-through to the lower and upper conductor planes. The height of the components that may be enclosed depends on the diameter of the balls.

The invention claimed is:

1. A method for producing an electronic module with an integrated electromagnetic shield having a network of interconnection balls and shielding balls (7) or preforms which are geometrically identical and surface-mounted components (2) on a substrate (1), said substrate having a mounting surface having predetermined mounting lands for the interconnection balls and shielding balls (7) and surface-mounted components and said surface-mounted components being electronic devices used for ensuring electronic function, the method including:

depositing soldering cream (8) onto the mounting lands for the surface-mounted components and the interconnection balls and shielding balls, which are to be located on the mounting surface of the substrate, simultaneously;

transferring the surface-mounted components onto the deposited soldering cream on the corresponding mounting lands;

transferring the interconnection balls and shielding balls collectively onto the deposited soldering cream on the corresponding mounting lands on the mounting surface, which is the same side of the substrate as for the surface-mounted components; and soldering with a single reflow cycle the surface-mounted components and the interconnection balls and shielding balls onto the substrate, simultaneously, such that the electronic module is in the shape of a ball housing and is directly connectable to the printed circuit and that the shielding balls insure the electromagnetic shielding of the components situated on the lower face of the substrate among the interconnection balls and shielding balls.

2. The method as claimed in claim 1, wherein the soldering cream (8) is deposited via serigraphy.

3. The method as claimed in claim 1, wherein the soldering cream (8) is deposited by syringe.

4. The method as claimed in claim 1, wherein the components (2) located on the lower face of the substrate 1 among the interconnection balls and shielding balls are decoupling capacitors (17) and/or serial resistors (16) and/or filtering cells and/or quartz adapter condensers are/is integrated as close to the interconnection balls and shielding balls (7) as possible and on the mounting surface of the electronic module.

5. The method as claimed in claim 1, the electronic module having a gripping surface, wherein the transferring step includes gripping the gripping surface of the module by vacuum suction and transferring it to the printed circuit.

6. The method as claimed in claim 1, wherein the soldering step further comprises directly connecting the module to the substrate.

7. The method as claimed in claim 1, wherein the interconnection balls and shielding balls have a diameter greater than the height of said surface-mounted components.

* * * * *